United States Patent [19]

Pearlman

[11] Patent Number: 6,121,775
[45] Date of Patent: Sep. 19, 2000

[54] MRI IMAGING METHOD AND APPARATUS

[75] Inventor: Justin D. Pearlman, Brookline, Mass.

[73] Assignee: Beth Israel Deaconess Medical Center, Inc., Boston, Mass.

[21] Appl. No.: 09/098,175

[22] Filed: Jun. 16, 1998

[51] Int. Cl.[7] .................................................. G01V 3/00
[52] U.S. Cl. ........................ 324/309; 324/318; 324/300; 128/653
[58] Field of Search .................................. 324/309, 318, 324/300; 128/653; 600/410

[56] References Cited

U.S. PATENT DOCUMENTS

| | | | |
|---|---|---|---|
| 4,901,020 | 2/1990 | Ladebeck et al. | 324/309 |
| 5,031,624 | 7/1991 | Mistretta et al. | 128/653 |
| 5,055,790 | 10/1991 | Siuciak et al. | 324/309 |
| 5,214,382 | 5/1993 | Harms et al. | 324/309 |
| 5,602,891 | 2/1997 | Pearlman | 324/309 |

OTHER PUBLICATIONS

Crooks, L. & Kaufman, L., "Instrumentation Techniques", Magnetic Resonance Imaging of the Body, 1987, p. 11.
"Magnetic Resonance Imaging", Section 7.28, pp. 357–367.
Hanahan, D., "Signaling Vascular Morphogenesis and Maintance", Science, vol. 277, Jul. 4, 1997, pp. 48–50.
Colleti, P. et al., "Magnetic Resonance of the Inferior Vena Cava", Magnetic Resonance Imaging, vol. 10, 1992, pp. 177–185.
Frank, H. et al., "Magnetic Resonance Imaging of Absent Pulmonary Valve Syndrome", Pediatric Cardiology, 1996, vol. 17, pp. 35–39.
Pearlman, J. et al., "Magnetic resonance mapping demonstrates benefits of VEGF–induced myocardial angiogenesis", Nature Medicine, vol. 1, No. 10, Oct. 1995, pp. 1085–1089.

Primary Examiner—Christine K. Oda
Assistant Examiner—Brij B. Shrivastav
Attorney, Agent, or Firm—Wolf, Greenfield & Sacks, P.C.; James H. Morris

[57] ABSTRACT

A method of magnetic resonance imaging for enhanced imaging, especially of small features or interfering tissue structures, and applicable to collateral vessels, such as neovascularization in a tumor or collateralization of the cardiac wall, as well as to tissue with impaired perfusion. The method creates a spatial hybrid image by arranging two or more magnetization conditions that evolve differently in various tissues of the region, and coordinating the gradient preparation/signal collection with a signal evolution in particular tissues. Transformation of the collected magnetic response data then forms a single image, and the hybrid contrast mechanisms suppress interfering effects or provide enhanced image data for particular structures in the field of view. A preferred practice of the method applied to a beating heart establishes a magnetization state of circulating blood and applies a pulse sequence to image the heart with $T_2^*$ contrast followed by $T_1$ contrast. Higher spatial frequencies are collected before the lower spatial frequencies, and the combined set of collected data are transformed to yield an MRI image showing heart wall tissue with enhanced $T_2^*$ contrast and the ventricle with $T_1$ contrast. This process eliminates the dominant $T_2$ image blackout when the ventricle fills with a susceptibility agent, and also introduces a geometry-dependent flare to enhance the signal from the collaterals despite the small volumes involved. The technique effectively distinguishes a number of interfering or confounding effects to effectively display evolving collateralization as well as better developed systems wherein the extent of collateralization has effectively replaced the circulation of an occluded vessel.

23 Claims, 5 Drawing Sheets a) Baseline (T=0)  b) T=10.2 seconds  c) T=19.6 seconds  d) T=38.3 seconds

MRI IMAGING METHOD AND APPARATUS

TECHNICAL FIELD

The present invention relates to tissue imaging, and particularly to magnetic resonance imaging (MRI).

BACKGROUND OF THE INVENTION

Neovascularization in mature adult tissues is a tightly regulated process that can occur in a number physiological and pathophysiological conditions. In particular, myocardial collateral vessels in coronary circulation can develop in response to progressive coronary artery occlusion. These coronary collaterals are natural bypass vessels that can develop in the ischemic areas of the heart to provide an alternate route for nutrient blood supply. Typical myocardial collaterals are small thin-walled vessels, ranging from about forty to about two hundred micrometers in diameter, and their presence is an indication of advanced coronary disease. Although coronary collaterals are not detected in all patients with advanced coronary disease, their presence is associated with smaller infarcts and a more benign clinical course. Sufficient collateralization can prevent the damage of heart attack. Beyond its significance in a cardiac setting, neovascularization is also a hallmark of cancer growth. For both of these reasons, identification of collateral circulation is clinically important. Despite its value, identification of collateralized tissue has to date been quite limited due to the insensitivity of presently available detection techniques. These techniques include contrast angiography that can identify vessels greater than about one hundred eighty micrometers in size, and various nuclear perfusion cardiac imaging techniques that identify areas with preserved blood supply.

Several conventional technologies seek to therapeutically stimulate growth of collateral vessels. These include a number of heparin-binding growth factors that augment the growth and formation of coronary collateral circulation in the setting of myocardial ischemia. Other physical, mechanical or biochemical treatments have also been proposed as potential promoters of neovascularization, including techniques such as creating burns into the myocardium. However, these technologies are still too immature for implementation in successful treatment protocols. The ability to image the affected tissue is extremely limited; presently, there are no reliable noninvasive techniques capable of identifying and tracking the development of collateral vessels. Neovascularization is also important in cancer control, where the goal is to impede new vessel development which supports tumours.

The present invention seeks to address this problem, and a more general tissue imaging problem, by resolving several limitations of magnetic resonance imaging (MRI) to form images of clinical utility.

There remains a need for an effective method and device to image small sparse targets such as neovascularization and collateral vessels in vivo.

There is also a need for MRI protocols which can enhance contrast or more effectively resolve features relevant to a range of diagnostic criteria, particularly criteria based on perfusion, neovascularization, or small vessel activity in the tissue under consideration.

SUMMARY OF THE INVENTION

These and other desirable features are achieved in accordance with the present invention by an MRI apparatus and imaging process which prepares the magnetization and data collection to enhance a specific spatial characteristic tissue features, for example to image small, sparsely distributed features. The imaging process involves preparing the tissue to have at least two contrast mechanisms which evolve differently in different tissues, and includes the step of performing spatially sensitive collection of the signal over time to preferentially enhance parts of the imaged tissue with hybrid contrast. The collected signal data may therefore include in the same image normally interfering tissue structures which may, for example, differ in both spatial feature size and temporal distribution of their magnetization characteristics. In a preferred example, the features are collateral vessels, and the two structures are the left ventricle and the collateral vessels of the nearby cardiac wall. The magnetization is prepared, for example a marker is administered, so that in the course of several seconds prepared blood passes through the ventricle, into the small vessels of the myocardium, and is then distributed into myocardial wall tissue. In accordance with the present invention, magnetic resonance imaging is carried out during the interval when the contrast agent is passing through collateral vessels, and is thus sparsely distributed, so that the local field changes result in sharp gradients that quickly scramble magnetization.

Covering the interval from arrival of the contrast to perfusion, imaging is performed, preferably with $T_2$ preparation and using a fast imaging sequence, to delineate the collateralized tissue region with $T_2$ contrast, while data collection is carried out in a reordered sequence that eliminates the ventricular filling blackout signal component and replaces it with a $T_1$-enhanced normal image component. Two dimensional Fourier transformation of the spatial frequency data collected in this manner then produces an anatomically accurate wholeheart image in which the collateralized region is clearly delineated. The image information reflects MR data signals collected from small and large structures with different weightings and at different times. It suppresses artifacts such as the transient ventricular blackout, and enhances the evolving image contrasts to display the target of interest.

Preferably a fast imaging sequence is used to perform all signal collection within a single heartbeat. $T_2^*$ contrast may further be enhanced prior to the fast imaging sequence. The imaging gradients are applied in an order such that during the initial transit of the prepared magnetization or agent through the ventricle, only lines of higher order in k-space are collected, effectively reducing the large signal components from the ventricle in $k_0$, $k_1$ and $k_2$ . . . , while preserving the contributions of myocardial collateral vessels represented in the higher frequencies, during the period of maximum $T_2^*$ contrast effect. The lower spatial frequency lines are collected later, out of order, when recovering magnetization has built up and the image is $T_1$ enhanced. The combined steps effectively remove the overriding dark flash of initial ventricular filling and the subsequent changes during general tissue perfusion, to provide an anatomically correct image in which the collateralized myocardium is clearly resolved against surrounding normal contrast cardiac features.

The method may also be applied to detect neovascularization in active tumors, and to detect the presence or degree of activity in small vessels, and to image conditions such as pulmonary infections or congestive states that affect circulation or perfusion over a region, or in a tissue that is otherwise difficult to image adequately. In addition, the present invention may be useful in monitoring the impact and dose response of agents, such as endostatin and angiostatin.

BRIEF DESCRIPTION OF THE DRAWINGS

These and other features of the invention will be understood from the description and claims herein, read in light of the background knowledge of a person skilled in the field, together with the drawings illustrating embodiments and aspects thereof, wherein

DETAILED DESCRIPTION

Figure 1:
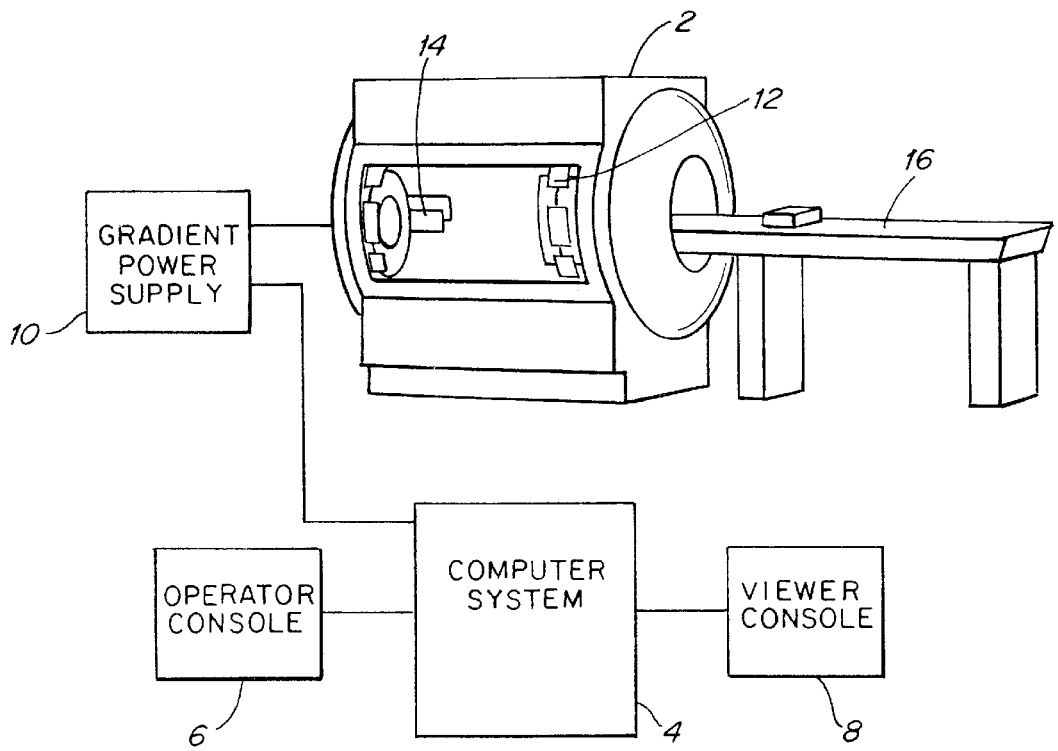
FIG. 1 shows an MRI apparatus suitable for practicing an embodiment of the present invention.

The illustrative embodiment of the present invention employs MRI imaging techniques to produce anatomically accurate wholeheart images in which collateralized regions are clearly delineated. The approach employed in the illustrative embodiment to the present invention uses contrast agents that evolve differently in different tissues. Magnetic resonance imagining is carried out during the interval when a contrast agent is passing through collateral vessels. During this interval, the contrast agent is sparsely distributed so that local magnetic field changes result in sharp gradients that quickly scramble magnetization. Specifically, $T_2$ preparation is performed, and a fast imaging sequence is performed to delineate collateral tissue regions with $T_2$ contrast. Data collection is carried out in a sequence that eliminates the ventricular filling blacked out signal component and replaces the blacked out component with a $T_1$ enhanced normal image component. The resulting data is subject to a two-dimensional Fourier transform to produce the whole image.

In order to better appreciate operation of the illustrative embodiment of the present invention, it is helpful to provide some background regarding review the basics of MRI.

MRI looks at its target as a set of volume elements arranged in rows, columns and slices, and reports the magnetization state in each volume element or "voxel" as a light-intensity value in the form of images. A set of coils generally provides a high strength homogeneous magnetic field with a smaller gradient field superimposed, so that the nuclear magnetic moments are brought into alignment in a field whose strength is known and which varies along the gradient. Magnetization states are represented by vectors which rotate due to the spin property of the atomic nuclei that generate the magnetization. These magnetization states are manipulated with radio waves to be detectable and to bring out specific contrasts between underlying tissues or their constituents based on a number of different factors reflecting their anatomy and physiology. In response to a pulse of radio signal energy, the magnetization vectors rotate from net alignment with the applied magnetic field. A 90-degree rotation takes all available magnetization and places it perpendicular to the applied magnetic field, while lower degrees of rotation take a smaller portion for signal generation. The magnetization thus placed perpendicular or transverse to the applied magnetic field oscillates in the transverse plane and is detected by an antenna, and the detectable signals are obtained in such a way that they may be processed, for example by two dimensional Fourier transformation of the spatial frequency data, to yield an image in which the image brightness at each point corresponds to the magnetization at a particular time in the corresponding imaged points of the interrogated region.

The magnetization of nuclei changes on two time scales—$T_1$, a measure of the time it takes for tissue magnetization to settle into a steady maximal value in the applied field, and $T_2^*$, a measure of how quickly the detectable transverse magnetization gets scrambled. The star (*) in $T_2^*$ indicates inclusion of the scrambling effect of magnetic field inhomogeneities in addition to the intrinsic scrambling due to thermal activity. The variations in these two magnetization characteristics are used for two common forms of MR imaging, namely $T_1$-weighted imaging, which produces an image that predominantly reports how quickly magnetization recovers, and $T_2^*$-weighted imaging, which produces an image that predominantly reports how quickly the population of aligned magnetization vectors, hence the detectable signal, gets scrambled. Certain conditioning sequences allow one to further experimentally distinguish between the intrinsic scrambling ($T_2$) and $T_2^*$.

One limitation of the MR imaging process is the need to take numerous "shots" (i.e. setting up and conditioning the magnetizations and then reading them) in order to image a region. Typically the data for an image require sixty four or more excitations, waiting for recovery of magnetization between successive shots. Several techniques allow multiple excitations and reads to be clustered together to reduce the total time required for an image, and when the tissue is moving too quickly for even these fast imaging sequences, other image construction techniques may be implemented. For example, one way to image a moving target such as the heart is to synchronize to the external EKG signal; this allows one to construct a composite image formed from multiple partial sets of image data taken at matching positions during successive heart beats. However, such a composite image suffers from a number of artifacts, and would not be useful when the effect to be observed in the tissue is itself a transient or quickly changing effect. Another major complicating factor, and fundamental limitation, of MR imaging is the weakness of the signal assigned to each voxel. This results from much of the magnetization (99.9993%) canceling under the best of conditions. The detectable signal must compete with noise from body heat, so signal-to-noise ratio is a limiting factor when one tries to enhance resolution: the signal diminishes in proportion to smallness of voxel dimension, while noise comes from the entire region independently of voxel size. For isotropic voxels, signal therefore drops as the cube of the voxel width. This factor generally sets a lower limit on achievable voxel dimension, which represents the image resolution and is the smallest discernible target. In clinical practice, resolution of MRI devices ranges from about 0.8 to about 10 mm, which is one or two orders of magnitude too large for directly viewing myocardial collateral vessels.

A target or a small feature in a large field of view can be identified if it sends up a "flare". Conceptually, conditioning the tissue by applying magnetic field gradients may be seen as such a technique. Gradients modify the phase of magnetization, which may be used to image the circulating blood and to measure its velocity. In addition, certain contrast enhancement agents have been developed for MRI, such as Gadolinium-based enhancement agents, which can heighten the apparent contrast of the image by changing $T_1$ and/or $T_2^*$. For example, tissues with short $T_2^*$ appear visually darker than other tissues when imaged with a $T_2^*$-weighted imaging sequence.

Gadolinium and other contrast agents in tissue also change the magnetic susceptibility or strength of response of the tissue to the applied magnetic fields. When such agents are confined to a chamber of the heart or to a blood vessel, the difference in magnetization between the agent-loaded inside and the surrounding tissue results in a localized magnetic field gradient that contributes strongly to $T_2^*$ signal decay. When the heart chambers fill with such an agent, the resultant gradient typically causes a blackout of the surrounding tissue. If the contrast agent is delivered only to and confined in the collateral vessels, such blackout may serve as a marking flare to enhance the image of the collaterals. However, the collateral vessels are fed through the heart, and delivery of the agent through the circulation produces a blackout of all surrounding tissue chambers fill the heart with contrast agent. This large blackout effect can obscure the local marker effect on collateralized myocardium. While there is a slight temporal delay between the initial cardiac chamber filling and subsequent normal vessel and collateral vessel circulation, these processes overlap by varying amounts in time, and are both short-lived and spatially close, so that data collection over multiple heartbeats cannot be expected to improve the image, and even a fast imaging sequence may not enjoy any time interval in which it is possible to effectively resolve features of interest.

FIG. 1 shows a general magnetic resonance imaging apparatus used in the practice of an illustrative embodiment of the present invention. A computer system 4 provides control, signal processing and message display modules for the system. The computer system 4 controls magnet coils and also controls RF pulse transmission and signal reception units placed about a patient P on a table 16. An operator console 6 is coupled to the computer system 4 to allow the operator to communicate with and control the system. A viewer console 8 is provided to allow a viewer to view the images produced as a result of the MRI. A gradient power supply 10 is connected to the computer system 4 and includes the basic power conditioning and switching circuitry for energizing a first set of coils 12 that establish a high and homogeneous magnetic field, typically in the range of one to five Tesla, in the patient examination region. The power supply 10 also energies a second set of coils 14 to superimpose a precisely defined magnetic gradient on the basic field. The strong field established by the first set of coils 12 defines a preferred direction for the magnetic dipoles of protons in the subject. In practice, the magnetic field alignment is a relatively mild influence compared to the tumbling from body heat, and only a small excess, about seven protons per million, will align with the high applied magnetic field. The other system components operate to detect these aligned protons in nuclei residing in the field. As is well known, the gradient power supply 10 sets the gradient so that the signal emitted by each position in the examination region varies in accordance with the field in that region, resulting in distinctive phase/frequency information. A number of successive conditioning and reading steps then accumulate sufficient lines of k-space data to enable the magnetization distribution in the region to be calculated by the computer from the collected signals.

In accordance with a preferred embodiment of the present invention, the apparatus is operated to image collateral circulation in the myocardium using magnetization preparation and/or a contrast agent which alters the magnetic susceptibility in collateral vessels and produces a dark flash as it travels through the collateralized tissue imaged in $T_2^*$ contrast, while signal data is otherwise manipulated or processed to either remove interfering image regions or fill in missing image regional data.

To set up such a flare for identification of sparse collateral vessels in a large field of view, applicant in a proof of principal experiment administered a magnetic susceptibility agent, e.g. a gadolinium contrast agent such as SO43 of Sterling/Nicomed or gadodiamide agent. Gadolinium picks up a relatively large fraction of the magnetization that is applied during MRI, and uniformly distributed gadolinium in tissues has been used to enhance an MR signal. However, heterogeneous distribution results in local magnetic field gradients between high and low susceptibility locations, and these gradients rapidly scramble detectable signal. Thus gadolinium arrival to a tissue supplied by sparsely distributed small vessels could, in principle, be detected in $T_2^*$-weighted images. However, because the arrival occurs at a particular time after the agent enters the heart, and also because other tissue structures with different properties or circulation characteristics lie quite close to the myocardium, complications arise during an attempt to image the collateral tissue in this way.

Figures 2A, 2B, 2C, 2D:
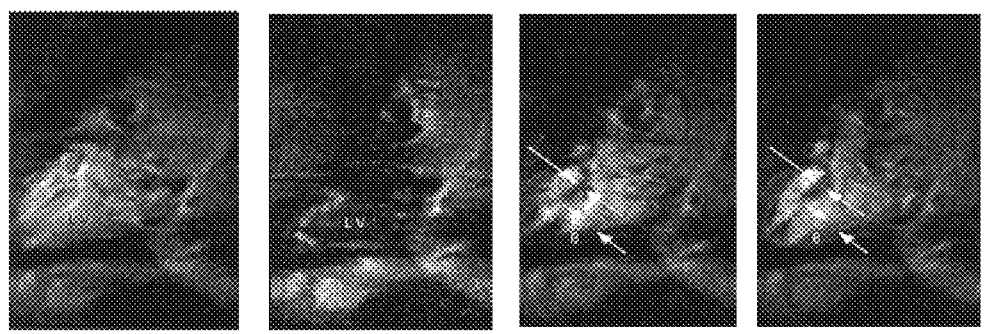
FIGS. 2A–2D show $T_2^*$ weighted MR images as a magnetic susceptibility agent arrives via the blood stream and during subsequent stages of evolving and passing flare to illustrate susceptibility effects on the image in various tissue regions.

FIGS. 2A–2D illustrate cardiac MRI images at baseline and at intervals of ten seconds following arrival of the agent, showing the complex effect of the interaction of susceptibility agent on MRI images. FIGS. 2A and 2B show a $T_2^*$-weighted baseline image and a later image as a magnetic susceptibility agent arrives via the blood stream. Such a purely $T_2^*$-weighted image may be obtained by "one-shot" or echo-planar imaging, so that magnetization recovery ($T_1$) does not play a role. In an imaging sequence of this type, all available magnetization is tipped to the transverse plane by applying an RF pulse to cause a 90 degree rotation, then all information to form an image is collected. The image formed in this manner has relatively low quality because of the limited time available to collect signal before it is dissipated due to T2*. The echo planar imaging was very sensitive to magnetic field inhomogeneities, including those introduced by the susceptibility agent. The imaging protocol for these figures consisted of a series of one-shot EKG-triggered data collections which were synchronized to every second diastole. As shown in FIG. 2B, the "flare" due to the magnetic susceptibility agent extends not only from collaterals into surrounding myocardium, but also from blood in the left ventricle out into the chest. Thus, when the contrast agent fills the left ventricle, an image-darkening and through-space blooming effect substantially blots out the myocardium too.

As the agent passes out of the major chambers and vessels this overwhelming loss of signal abates. During this period the agent enters the small vessels of the myocardium, and regions of blocked circulation become the first to clear, appearing bright, as shown in region A of FIG. 2C. The remainder of the myocardium in which the agent is distributed appears dark (region B). The myocardial borders, shown by arrow in FIGS. 2C and 2D, gradually become better delineated due to washout of the large through-space effect that occurred when the left ventricle was full of susceptibility agent. The timing of this washout and progressive darkening thus offers the prospect of deriving a quantitative measure of flow by measuring the differential return of signal during the five to forty second interval following ventricular filling. While the first few seconds or so are masked by the by the signal loss associated with filling of the heart chamber, if a dark flash is delayed more than five seconds, it may then be identified. However, because an adequately collateralized wall may have no arrival delay, it would have to somehow be distinguishable earlier. The foregoing images were acquired using echo-planar imaging for high $T_2^*$ sensitivity and synthesized from data that was EKG triggered to every second diastole to fill a 256×256 matrix, with a 90° flip, TE=20 msec and FOV= 270×270 mm.

To change the relative amounts of detectable signal under these conditions and improve image quality, the applicant sought to collect more signal within a single heartbeat using a turbo-FLASH imaging sequence. This applies a series of a small and progressive (5–15 degrees) radio pulses that each makes a fresh small portion of the available magnetization transverse for signal generation. By using such multiple excitations, $T_1$ recovery enters into the image contrast; this is a mechanism which is not very sensitive to the distribution of the magnetic susceptibility agent in sparse vessels.

Figure 3:
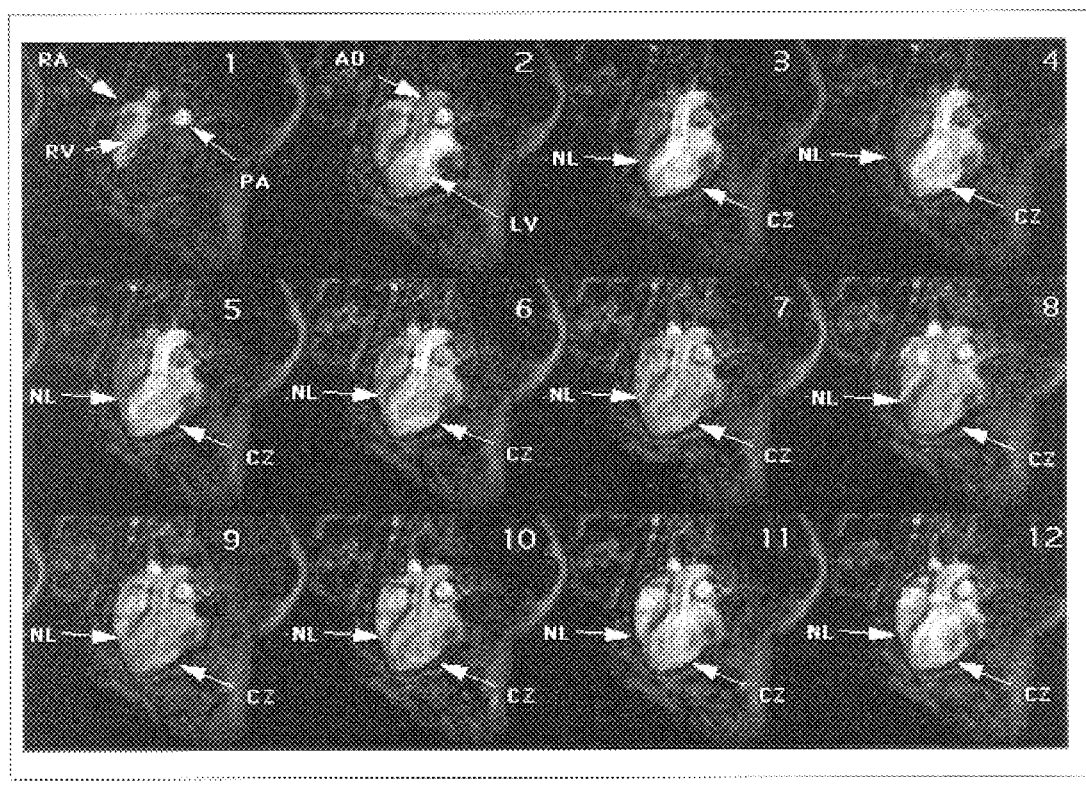
FIG. 3 is a panel of successive images of a heart taken with multiple excitations to enhance $T_1$ recovery.

FIG. 3 is composed of twelve panels showing the $T_1$, turbo-FLASH image of a heart at twelve successive times during arrival and clearance of a gadodiamide susceptibility agent. An inversion recovery sequence was used in which the magnetization was inverted and imaging was carried out at the time when magnetization in a normal heart passes from the inverted value, through zero, towards its equilibrium value. The $T_1$ effect of the contrast agent reduced recovery time of tissue in immediate contact with the contrast agent, so magnetization was not zero at the time of imaging for the locations associated with the contrast agent. With this turbo-FLASH imaging protocol the image frames are acquired quickly, and the images start dark and get brighter. Furthermore, the through-space darkening effect is minimal. In panel 1 of FIG. 3 the locations of right atrium, right ventricle and pulmonary artery are indicated by RA, RV and PA. The left ventricle LV and aorta AO become visible in panel 2, and the normal tissue zone NL brightens in panels 5–9. In this particular heart, collateralization was marginal, and therefore was associated with impaired blood delivery, so the zone of the tissue dependent on collateral vessels, indicated by CZ, remains dark until a significantly later time, shown in panel 12 of FIG. 3.

As appears from this sequence of images, the inversion-recovery TURBO-FLASH imaging with a bolus of contrast agent is useful for showing regional arrival delays and, by frame comparisons, clearance intervals. However, a well-developed collateralized zone would have little or no delay and so would not be distinguished from the normal zone by this imaging technique.

Figure 4:
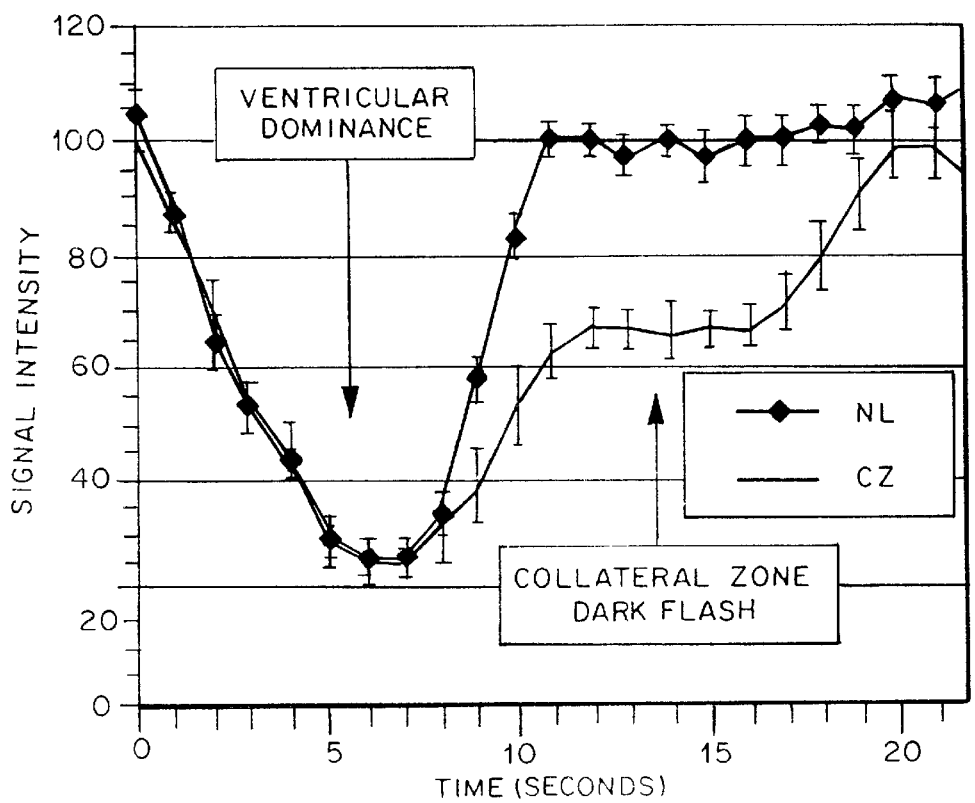
FIG. 4 shows signal intensity over time in images of collateralized and normal tissue using preparation pulses for $T_2^*$ contrast enhancement in the collaterals.

By adjusting the magnitude of the $T_2^*$ contrast effect and operating with fast imaging sequences applicant further explored whether the technique of FIGS. 1A–1D could be refined. One approach was to adjust further the level of the $T_2^*$ contrast, which was done by applying a 90/−90 series of two preparation pulses, followed by a spoiler. This placed magnetization transverse to the applied magnetic field, and then after a short time interval, returned it, so the Z-magnetization was reduced in length according to $T_2^*$. The time interval was set to an integer number of precession cycles to maximize signal. A turbo FISP imaging sequence was then applied. This protocol was applied repeatedly, imaging once per heart beat during bolus transit of the contrast agent over a twenty second period. Image intensity in both the normally vascularized tissue and collateralized tissue zones was plotted, as shown in FIG. 4. Initially, both normal and collateralized zones dropped signal when the $T_2^*$ effect on the contrast arrived in the left ventricle, due to the large through-space effect described above. This interval of ventricular dominance and low signal is identified by a downward arrow in the FIGURE. Subsequently, the time intensity curve for the collateralized zone CZ was distinct from that of the normal zone NL. Because the spacing of collaterals was sparse, arrival of contrast in the collateral microvessels resulted in a heterogeneity of magnetic susceptibility; this introduced localized magnetic dephasing, with a consequent diminution of MRI signal over a region of the surrounding myocardium. This transient darkening of the collateralized myocardium is referred to herein as "collateral dark flash". It is a strong marker, causing the very small volume of agent reaching the tissue to briefly bloom to a detectable level.

However, the images obtained in this way still had the above-noted problem that ventricular filling produced a transient blotting out of the myocardium. The collateralized zone exhibiting delayed arrival was visible, but was poorly demarcated. Moreover, under conditions where if the collaterals were better developed so as to actually be sufficient to provide rapid delivery of nutrient blood supply to heart muscle, such vessels would experience the susceptibility enhancement earlier in the circulatory path and thus could be entirely masked by the still-flaring signal from the ventricle. Moreover, the precise time intervals involved in clearing the ventricle, filling the collaterals, and perfusing into the myocardium may all be expected to vary. Thus, while partially collaterized tissue might be distinguishable, there was a definite degree of uncertainty as to whether this technique would image collateral development in a given individual.

In order to address this problem and to image more dependably the development of well-collateralized tissue, applicant therefore further refined the procedure to localize the susceptibility contrast "flare" to the immediate surrounds of the sparse collateral vessels within the myocardium while excluding the large space effect of filling the left ventricle.

In accordance with one aspect of the present invention, the through-space darkening effect is avoided or removed from the image by taking advantage of the spatial frequency sensitivity of the MR imaging process. Generally, MRI data are collected as summed samples of spatial frequency, with each sample summarizing the state of transverse magnetization contribution of waves at a spatial frequency. The zero spatial frequency component $k_o$ reports the average over the entire field, while a frequency of one reports left-right differences, and higher frequencies report finer differences. Applicant turned this spatial frequency ordering of the underlying signal data to advantage by re-arranging the order or relative times at which the customary sequence of magnetic gradients were applied, hence changing the order of the collection of the different frequencies, so that the spatial frequencies corresponding to different size structures were collected, at the times when those structures each exhibited well defined image information as their magnetization evolved during the imaging sequence. Thus, portions of the data for a single image were collected to have different contrast, with the early-collected signals $T_2^*$ weighted, and the later-collected ones $T_1$ weighted.

In the protocol described above, the data collected immediately after the preparation pulse effectively report $T_2^*$ contrast, while data collected well after the preparation pulse have $T_1$ recovery and minimal $T_2^*$ contrast. Thus data samples obtained immediately after the preparation pulse are $T_2^*$ weighted, while those much later are $T_1$ weighted. By first collecting the higher spatial frequency data, corresponding to differences on a scale of myocardial feature dimension less than approximately twice the wall thickness, (e.g. a spatial frequency less than about 16 millimeters) the collaterals are automatically imaged with $T_2^*$ weighting, while large structures, with a dimension on a scale of the left ventricle dimension, are maximally $T_1$ weighted and substantially $T_2^*$ insensitive. This imaging, which applicant calls spatial frequency hybrid imaging, results in images that are anatomically correct, and are "tuned" to image the collaterals as the contrast agent enters them. Thus when the susceptibility contrast agent passes through the collaterals, the myocardium in that vicinity flashes black. During the early interval when contrast agent fills the left ventricle, however, it has minimal effect, because the left ventricle is large and its signal dominates very low spatial frequencies, which are not collected until after the $T_2^*$ contrast weighting has subsided. Also, when the normally-vascularized zone fills uniformly with magnetic susceptibility agent, there is negligible $T_2^*$ contrast effect, because the normal vessels are sufficiently densely distributed that the presence of Gadolinium produces no significant magnetic gradient between high and low susceptibility regions.

Figure 5A:
FIG. 5A shows an MRI image of the present invention collected with reordered spatial frequencies to produce a dark flash confined to collateralized myocardium.
Figure 5B:
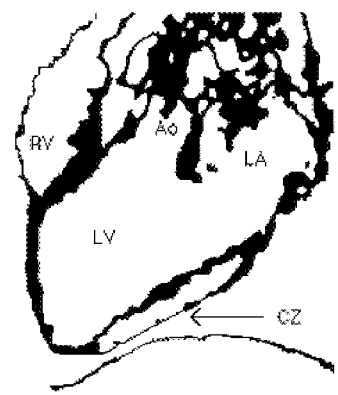
FIG. 5B shows a schematic image of the same heart with anatomic features labeled.

FIG. 5A illustrates a cardiac image with the dark flash confined to the collateralized myocardium by this MR imaging technique. A full cardiac image is obtained, with a large collateral dark flash in the circumflex distribution. FIG. 5B is a schematic of the MRI of FIG. 5A, labeling the different cardiac regions as in the earlier figures.

Having developed the basic technique applicant next investigated critical features of the dark flash to (1) confirm that the image enhancement was not due to wall motion, (2) determine that the targeting covers the entire range of wall thicknesses encountered, (3) verify correspondence of the extent of dark flash to the anatomical extent of collateralization of the myocardium, and (4) evaluate the ability of this MR imaging to identify and monitor developing collateral circulation in the heart.

EXAMPLE 1

The reliability of the method and its ability to monitor angiogenic response to administration of collateral growth factors were tested in 20 pigs in which chronic myocardial ischemia was induced by placement of an Ameroid constrictor on a coronary artery. In this model, the placement of plastic-encased Ameroid occluder on the proximal aspect of a coronary artery leads to progressive coronary occlusion secondary to gradual fluid absorption by the Ameroid material. This gradual narrowing of the coronary artery results in appearance of a large area of ischemic myocardium sustained by development of collateral circulation that can be augmented by growth factor (bFGF or VEGF) administration.

Fresh ex vivo imaging of hearts, which have no wall motion, excised six weeks after the Ameroid implantation showed collateral flash similar to that seen during in vivo imaging in the same animals. By reproducing the in vivo phenomenon in this way, applicant was able to rule out wall motion as a cause of collateral flash. To compare further the anatomical extent of MR collateral dark flash with the extent of the directly observable collateralized tissue bed, applicant compared MR maps of collateral zones to collateral zone mapping by ex vivo CT imaging in the same hearts. The CT imaging was accomplished by injection of dilute (1:4) Renograffin following cannulation of all three major epicardial coronary arteries, with the left circumflex artery cannulated distal to the occluder.

In order to correlate the extent of coronary blood flow in the zone demonstrating collateral flash to coronary flow in the rest of the myocardium, applicant analyzed the correlation between extent of collateralization as determined by MRI compared to the conventional measure from microsphere-determined blood flow collateral distribution (r=0.86). It is difficult to get a precise anatomic confirmation from this comparison, because microsphere resolution is low, about one $cm^3$, and does not provide 3D images of the collateral extent. Thus the microsphere comparison was limited to corresponding sections. For this reason applicant developed a much more precise validation method.

Figure 5C:
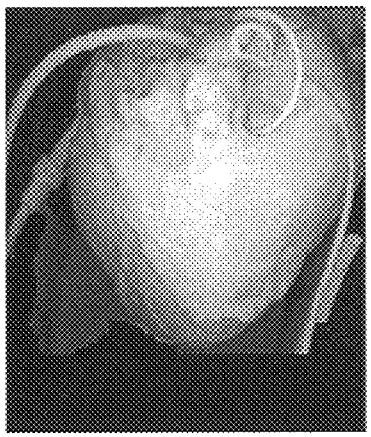
FIG. 5C shows a three dimensional computed tomographic reconstruction of the heart.
Figure 5D:
FIG. 5D is a multi-planar CT reconstruction of the cut surface image plane corresponding to FIG. 5A during injection of the LAD.

Three-dimensional imaging at 1 $mm^3$ resolution was achieved by contrast spiral CT images obtained with and without saline infusion into the distal left circumflex artery at pressures of 200, 150, 100, 50, and 0 mm Hg while contrast medium was mechanically injected in the left anterior descending and in the right coronary arteries. Following image acquisition with the acquisition parameters set at 12 cm. FOV, 180 mA, 120 kV, 1 mm. slice thickness, and a pitch of 2.5., elastic subtraction was used to produce three dimensional images of the difference. The elastic subtraction procedure is described in applicant's U.S. Pat. No. 5,602,891 issued on Feb. 11, 1997, which is hereby incorporated herein by reference. That imaging procedure automatically identifies points which have distinct tissue character between matched volume data sets, after accounting for elastic motions and misregistration. In this case, the identified points represent the myocardium that is filled with contrast by alternate routes only when the left circumflex territory is not pressurized, namely, the collateralized myocardium. In all cases the left circumflex territory did not fill or filled only faintly with contrast when the recipient territory was pressurized with a back-gradient of 50 mm Hg or higher. The 3D reconstruction of the heart was made by this ex vivo CT method and is shown in FIG. 5C. FIG. 5D shows a multi-planar reconstruction of the cut surface image plane corresponding to the MRI image of FIG. 5A. The correlation between the extent of collateralization as determined in the CT images and that determined in vivo MRI is high (r=0.95).

The extent of collateral development changes as a function of time following Ameroid occluder implantation, and administration of a number of growth factors including VEGF and bFGF have been shown to accelerate this process. To further test the power of this imaging method, applicant studied the extent of MR-determined collateral perfused myocardium at 3 and 6 weeks after Ameroid occluder placement, in the absence and in the presence of administration of VEGF. Larger extent in treated pigs correlated with improved flow/function, and the dose-response relation between angiogenic stimulus and MRI-determined collateral extent was clearly evident. Furthermore, increased size of the collateral zone as imaged by MR corresponded to decreased delay in the arrival of tagged blood, and to preservation of wall thickening and ejection fraction, despite complete occlusion of the normal supply artery.

Thus, the extent of MR-determined collateral-supplied myocardium correlated well with ex-vivo direct CT imaging performed with controlled transcoronary pressure gradients (r=0.95), and with extent of collateralization evident by microsphere analysis of blood flow distribution in the collateral-subtended tissues (r=0.86). Growth factor administration resulted in accelerated collateral development that led to improved blood flow to the affected tissue, and preservation of contractile function, with both these changes being observable with this MR imaging system. Double blinded assessment by the new imaging technique, which is referred to herein as CS-MRI (collateral sensitive MRI), correctly distinguished those who received growth factor from those who received placebo. The CS-MRI methodology thus appears valuable for detection of collateral circulation in vivo, as well as for assessment of prognosis and evaluation of new angiogenic treatment modalities in patients with coronary artery disease.

MRI, as used both clinically and in research, reports strength of transverse magnetization vs. signal location. Typically, the imaging is designed to emphasize $T_1$, $T_2$ or $T_2^*$. The above described technique used a magnetization preparation to achieve $T_2^*$ contrast in a sequence that is normally $T_1$ weighted, while combining and ordering the data collection steps to make a smooth transition from $T_2^*$ imaging weight during the collection of spatial frequencies dominant in setting the contrast for the myocardial wall, to $T_1$-weighted data while collecting the spatial frequencies prominent in setting the impact of the left ventricle on the images. When the collection of spatial frequency data is transformed to an image series, the images have a distinctive dark flash due to arrival of magnetic susceptibility contrast in sparse vessels, while avoiding artifacts due to magnetic susceptibility changes during the ventricular filling. Separately, $T_1$-weighted imaging with inversion recovery identifies areas of delayed or absent blood delivery. The described imaging sequence is fast enough to obtain images at sixteen phases through the cardiac contraction cycle to determine wall thickening, and dynamic traits such as radial wall motion and ejection fraction.

The foregoing technique for imaging the time of arrival of contrast-labeled blood in vessels of a small size is a useful addition to thallium perfusion imaging in that it identifies important structure in zones of impaired blood delivery, and identifies regions supplied by collateral vessel geometry independent of whether the blood delivery is impaired. By contrast, thallium perfusion has been less than fully reliable in predicting the presence of collaterals because effective collaterals may leave no impairment in blood delivery.

The contrast agent has several effects with different time profiles, due to circulation, that also operate in tissues of different size, while the preparation also introduces a targeted contrast variation. The temporal ordering of the spatial frequency collection from fine to coarse operates to exclude certain whole image interference (the through space darkening) while making the local contrast effect visible against normal contrast surroundings, effectively producing a composite image which has been spatio-temporally selected from sets of image data evolving along three or more axes.

The dark flash occurs due to both the spacing and size geometry of collaterals, such that when contrast agent first arrives, magnetic susceptibility is high in the collaterals and low between them. This mechanism, a size and geometry-sensitive local magnetic field gradient that spoils coherence of phase of transverse magnetization and results in rapid cancellation of the magnetization vectors in the affected region, offers new possibilities for enhanced imaging in a variety of in vivo situations where magnetization properties, tissue feature size and temporal, or flow or perfusion characteristics vary between otherwise confounding tissues. In particular, by establishing gradients to collect fine spatial data first, one can exclude confounding effects from large tissue structures, or arrange to collect their image contribution at a particular time along their magnetization curve. In the preferred embodiment described above, both effects operate, excluding the large through space $T_2^*$ darkening while collecting $T_1$ normal contrast data for the heart chambers, so that the $T_2^*$ fine structure appears in distinct contrast to its surroundings. Thus, by arranging for two differently evolving magnetization mechanisms to be present, and coordinating the gradient collection steps with the evolving, contrast in different size tissues, the invention provides a powerful methodology for adjusting contrast, enhancing signal and producing whole region images of enhanced resolution and fidelity. Different markers or preparation may be used to adjust contrast, exclude artifacts, or both, when forming such a spatial hybrid image.

The invention being thus disclosed and representative implementations thereof described, further variations and modifications will occur to those skilled in the art, and such variations and modifications are considered to be within the scope of the invention, as defined in the claims appended hereto.

What is claimed is:

1. An MRI apparatus useful for contrast imaging of tissue, such apparatus comprising a magnet assembly for establishing a magnetic field including a gradient in a region of tissue RF means for applying an RF excitation to the region of tissue for absorption by nuclear elements residing in said region antenna means for receiving RF signals emitted by the nuclear elements, and control means for controlling said magnet assembly and said RF means such that the RF signals received by the antenna means form lines of k-space data wherein the control means controls said magnet means and RF means to fill lines of k-space data having high spatial frequency separately from lines having low spatial frequency such that transformation to a spin-density image forms a hybrid image wherein evolving magnetization occurring during acquisition of image data adjusts image contrast between large tissue structures and fine tissue structures.

2. An MRI apparatus according to claim 1, wherein said control means controls to effect fast imaging synchronized with creation of local gradients by a flowing susceptibility agent to achieve localized $T_2^*$ contrast enhancement.

3. A method of forming an in vivo magnetic resonance image of a region containing first and second biological tissues of a different size, such method comprising the steps of:

establishing magnetization states such that a first and a second contrast conditions evolve differently in the first and second biological tissues over time;

coordinating collection of gradient magnetic response data with said evolving contrast conditions to enhance the distinction in the responses for the first biological tissue with a first contrast and response data for the second biological tissue with a second contrast; and forming a single hybrid image from the response data to image both the first and second biological tissues.

4. A method according to claim 3, wherein the step of coordinating is performed by coordinating spatial encoding gradients with flow of a contrast agent through the first and second biological tissues.

5. A method according to claim 3, further comprising the step of applying one or more RF pulses during each collection to adjust contrast level of one evolving contrast condition.

6. A method according to claim 3, wherein the step of coordinating is performed to suppress a regional signal blackout while enhancing the signal indicative of small vessels.

7. A method according to claim 3, wherein the step of coordinating is carried out to sharply delineate one of the first and second biological tissues having a perfusion anomaly.

8. A method of forming a magnetic resonance image of collateral vessels, such method comprising the steps of establishing a magnetization state of blood;

applying a pulse sequence to modulate contrast, whereby T1 and T2* magnetic contributions evolve distinctly over time; and ordering phase encoding gradients to collect higher spatial frequencies separate from lower spatial frequencies such that portions of the MRI image so formed show target tissue with modulated contrast.

9. The method of claim 8, wherein the step of establishing a magnetization state of blood includes establishing said state by applying a magnetic gradient to establish said state prior to arrival of the blood at the target tissue.

10. The method of claim 8, wherein the step of establishing a magnetization state of blood includes injecting a contrast agent to determine temporal evolution of said state.

11. The method of claim 10, wherein the contrast agent accelerates decay of the magnetization state to produce a dark flash as said agent enters a vessel.

12. The method of claim 8, wherein the step of collecting includes collecting high spatial frequencies to detect circulation of a darkening contrast agent through collateral vessels, while arranging that low spatial frequencies are collected under distinct contract sensitivity conditions, and transforming the spatial frequencies so collected to form an image in which a region containing the collateral vessels is distinguished.

13. The method of claim 8, further including the step of conditioning spins to adjust image contrast.

14. The method of claim 13, wherein the step of adjusting image contrast is performed by applying a first pulse to flip magnetization states so that the states decay, and after a time interval applying a second pulse to realign magnetization states with a reduced amplitude thereby changing contrast by an amount corresponding to decay time of the imaged tissue.

15. The method of claim 13, wherein the step of adjusting contrast is performed by applying a plurality of RF pulses and changes of gradient to sensitize magnetization to magnetic susceptibility.

16. The method of claim 13, wherein the step of adjusting contrast is performed by applying a plurality of RF pulses and changes of gradient to sensitize magnetization to diffusion.

17. The method of claim 13, wherein the step of adjusting contrast is performed by applying a plurality of RF pulses and changes of gradient to sensitize magnetization to spectral chemistry of the imaged tissue.

18. The method of claim 13, wherein the step of adjusting contrast is performed by applying a plurality of RF pulses and changes of gradient to sensitize magnetization to motion of the imaged material.

19. In an MRI method of in vivo imaging of visually adjacent or signal-overlapping fluid communicating tissue structures having different initial times and residence periods of fluid passing therethrough, and including a gross tissue structure with an early fluid arrival time and a fine tissue structure with a later fluid arrival time, the improvement comprising imaging fluid arrival in the structure with $T_2$ contrast while collecting higher spatial frequencies separate from lower spatial frequencies so as to enhance $T_2$ imaging of the fine tissue structure.

20. The MRI method of claim 19, wherein the step of imaging with $T_2$ contrast is performed by imaging with a susceptibility agent effective to produce a scrambling gradient as it enters small sparsely-spaced vessels.

21. In an MRI method of in vivo tissue imaging of a small spaced tissue structure having flow communication for fluid to pass therethrough, the improvement comprising administering a susceptibility agent to fluid so that it passes through the tissue structure, and imaging the structure with $T_2$ contrast enhancement as said agent passes therethrough, so that local gradients scramble magnetization and the tissue structure flashes black to enhance its visibility.

22. The MRI method of claim 21, wherein the step of imaging with $T_2$ contrast enhancement is performed by establishing magnetization in the fluid at a first site and imaging when the fluid reaches the tissue structure at a later time.

23. The MRI method of claim 21, wherein the step of imaging with $T_2$ contrast enhancement is performed by establishing a magnetization vector in the fluid and applying RF pulses to rotate magnetization into an orthogonal plane and reduce length of the magnetization vector by an amount effective to enhance said contrast, and realigning magnetization before collecting imaging data.

* * * * *